(12) United States Patent
Yoo et al.

(10) Patent No.: US 12,417,901 B2
(45) Date of Patent: Sep. 16, 2025

(54) APPARATUS FOR TREATING SUBSTRATE AND METHOD FOR ALIGNING DIELECTRIC PLATE USING THE SAME

(71) Applicant: PSK INC., Hwaseong-si (KR)

(72) Inventors: Kwang Sung Yoo, Hwaseong-si (KR); Ju Young Park, Hwaseong-si (KR)

(73) Assignee: PSK INC., Hwaseong-si (KR)

( * ) Notice: Subject to any disclaimer, the term of this patent is extended or adjusted under 35 U.S.C. 154(b) by 55 days.

(21) Appl. No.: 18/022,550

(22) PCT Filed: Dec. 2, 2021

(86) PCT No.: PCT/KR2021/018052
§ 371 (c)(1),
(2) Date: Feb. 22, 2023

(87) PCT Pub. No.: WO2023/033259
PCT Pub. Date: Sep. 3, 2023

(65) Prior Publication Data
US 2024/0274411 A1 Aug. 15, 2024

(30) Foreign Application Priority Data
Aug. 31, 2021 (KR) .......................... 10-2021-0115656

(51) Int. Cl.
*H01J 37/32* (2006.01)
(52) U.S. Cl.
CPC .... *H01J 37/32568* (2013.01); *H01J 37/3244* (2013.01); *H01J 37/32513* (2013.01);
(Continued)
(58) Field of Classification Search
CPC ........... C23C 16/4409; C23C 16/45589; H01J 37/32; H01J 37/32431; H01J 37/3244;
(Continued)

(56) References Cited

U.S. PATENT DOCUMENTS

2008/0179297 A1 7/2008 Bailey et al.
2010/0096087 A1* 4/2010 Sexton .............. H01J 37/32568
156/345.47
(Continued)

FOREIGN PATENT DOCUMENTS

CN 109698109 A 4/2019
KR 10-1346081 B1 12/2013
(Continued)

OTHER PUBLICATIONS

Office Action issued from Taiwanese Patent Application No. 110139792 issued on Aug. 31, 2021.
(Continued)

*Primary Examiner* — Benjamin Kendall
(74) *Attorney, Agent, or Firm* — Sughrue Mion, PLLC (57) ABSTRACT

Provided is an apparatus for treating a substrate. The apparatus for treating the substrate includes a housing defining a treatment space formed by a combination of an upper housing and a lower housing, a gas supply unit configured to supply gas to the treatment space, a support unit including a chuck configured to support the substrate in the treatment space and an upper electrode provided to surround the check when viewed from a top view, a dielectric plate unit including a dielectric plate arranged to oppose the substrate supported by the support unit in the treatment space, and an upper electrode unit coupled to the dielectric plate unit and including an upper electrode arranged to oppose the lower electrode, in which the upper electrode unit is coupled to the lower housing.

13 Claims, 8 Drawing Sheets

(52) U.S. Cl.
CPC .. *H01J 37/32715* (2013.01); *H01J 37/32743* (2013.01); *H01J 2237/2005* (2013.01); *H01J 2237/20235* (2013.01); *H01J 2237/334* (2013.01)

(58) Field of Classification Search
CPC ........... H01J 37/32513; H01J 37/32568; H01J 37/32715; H01J 37/32743; H01J 2237/2005; H01J 2237/20235; H01J 2237/334; H01L 21/67; H01L 21/67017; H01L 21/687
See application file for complete search history.

(56) References Cited

U.S. PATENT DOCUMENTS

| | | |
|---|---|---|
| 2010/0236717 A1 | 9/2010 | Chung et al. |
| 2011/0165779 A1* | 7/2011 | Sexton .............. H01J 37/32568 438/729 |
| 2019/0279846 A1 | 9/2019 | Lee et al. |
| 2020/0370177 A1 | 11/2020 | Franklin et al. |
| 2022/0059324 A1 | 2/2022 | Lee et al. |

FOREIGN PATENT DOCUMENTS

| | | |
|---|---|---|
| KR | 10-1653335 B1 | 9/2016 |
| KR | 10-2275757 B1 | 7/2021 |
| TW | 202106125 A | 2/2021 |

OTHER PUBLICATIONS

International Search Report for PCT/KR2021/018052 dated May 26, 2022 (PCT/ISA/210).

* cited by examiner

APPARATUS FOR TREATING SUBSTRATE AND METHOD FOR ALIGNING DIELECTRIC PLATE USING THE SAME

CROSS REFERENCE TO RELATED APPLICATIONS

This application is a National Stage of International Application No. PCT/KR2021/018052 filed Dec. 2, 2021, claiming priority based on Korean Patent Application No. 10-2021-0115656 filed Aug. 31, 2021, the disclosures of which are incorporated herein by reference in their entireties.

TECHNICAL FIELD

The present disclosure relates to an apparatus for treating a substrate and a method of aligning a dielectric plate, and more particularly, to an apparatus for treating a substrate by using plasma and a method of aligning a dielectric plate provided in the apparatus.

BACKGROUND ART

Plasma is an ionized gas state including ions, radicals, electrons, etc., and is generated in response to very high temperatures, strong electric fields, or radio frequency (RF) electromagnetic fields. A semiconductor device manufacturing process includes an ashing or etching process to remove a film material from a substrate by using plasma. The ashing or etching process is performed by collision or reaction of ions and radical particles contained in plasma with a film material on the substrate. A process of treating a substrate by using plasma may be performed in various manners. A bevel etching apparatus for etching an edge region of the substrate is used to treat the edge region of the substrate by irradiating plasma to the edge region of the substrate.

The bevel etching apparatus performs etching on the substrate by supplying a processing gas excited to a plasma state to the edge of the substrate. To prevent etching of other regions than the edge region of the substrate, a dielectric plate provided to an insulator is located on the substrate. To process the edge region of the substrate, adjustment of a relative position between the dielectric plate and the substrate is crucial.

However, separate inclusion of a structure for moving the dielectric plate causes spatial constraints in forming the interior of an existing bevel etching apparatus and increases the volume of the bevel etching apparatus.

DESCRIPTION OF EMBODIMENTS

Technical Problem

The present disclosure provides an apparatus for treating a substrate and a method of aligning a dielectric plate to efficiently control a relative position between an insulator and the substrate.

The present disclosure also provides an apparatus for treating a substrate and a method of aligning a dielectric plate, by which the efficiency of plasma treatment with respect to an edge region of the substrate may be further improved.

Problems to be solved by the present disclosure are not limited to the above-mentioned problems, and the problems not mentioned may be clearly understood by those of ordinary skill in the art to which the present disclosure belongs from the present specification and the accompanying drawings.

Solution to Problem

The present disclosure provides an apparatus for treating a substrate. The apparatus for treating the substrate includes a housing defining a treatment space formed by a combination of an upper housing and a lower housing, a gas supply unit configured to supply gas to the treatment space, a support unit including a chuck supporting the substrate in the treatment space and an upper electrode provided to surround the check when viewed from a top view, a dielectric plate unit including a dielectric plate arranged to oppose the substrate supported by the support unit in the treatment space, and an upper electrode unit coupled to the dielectric plate unit and including an upper electrode arranged to oppose the lower electrode, in which the upper electrode unit is coupled to the lower housing.

In an embodiment, a step may be provided on an upper portion of the lower housing, and the upper electrode unit may be placed on the step.

In an embodiment, the apparatus may further include a first shape portion formed on a bottom surface of the dielectric plate unit and a second shape portion formed on the support unit to correspond to the first shape portion in a preset position, in which any one of the first shape portion and the second shape portion is provided as a protrusion, and the other is provided as a groove.

In an embodiment, the apparatus may further include a driving member configured to lift and lower the support unit between a lowered position and a lifted position, in which the lowered position is a position where the substrate is carried into the treatment space, and the lifted position is a position where the first shape portion and the second shape portion contact each other.

In an embodiment, the substrate may be carried into the treatment space through a side surface of the housing.

In an embodiment, the substrate may be treated in the treatment space in a treatment position, and the treatment position may be between the lowered position and the lifted position.

In an embodiment, the apparatus may further include a sealing member provided between the upper housing and the lower housing to seal the treatment space.

In an embodiment, the upper electrode unit may further include a second base to which the upper electrode and the dielectric plate unit are coupled.

In an embodiment, the dielectric plate unit may further include a first base arranged between the dielectric plate and the temperature control plate.

In an embodiment, the gas supply unit may include a gas channel formed in a space where the first base and the second base are separated from each other, and a first gas supply unit configured to supply a process gas excited by plasma to the gas channel, and a discharge end of the gas channel may be oriented to an edge region of the substrate supported by the support unit.

In an embodiment, the gas supply unit may include a gas flow path provided in the dielectric plate and a second gas supply unit configured to supply an inert gas to the gas flow path, and the discharge end of the gas flow path may be formed toward a center region of the support supported by the support unit.

The present disclosure also provides a method of aligning a dielectric plate. The method includes aligning the dielectric plate in a preset position with respect to a support unit before or after treating the substrate in a treatment space, in which after the support unit is lifted to a lifted position, the dielectric plate unit may be coupled to a lower housing such that a first shape portion corresponds to a second shape portion.

In an embodiment, when the substrate is carried into the treatment space, the support unit may be placed in a lowered position lower than the lifted position.

In an embodiment, during treatment of the substrate in the treatment space, the support unit may be placed between the lifted position and the lowered position.

Advantageous Effects of Disclosure

According to an embodiment of the present disclosure, a substrate may be efficiently treated.

In addition, according to an embodiment of the present disclosure, plasma treatment may be uniformly performed on the substrate.

Moreover, according to an embodiment of the present disclosure, the efficiency of plasma treatment on an edge region of the substrate may be further improved.

Effects of the present disclosure are not limited to the above-described effects, and the effects not mentioned may be clearly understood by those of ordinary skill in the art to which the present disclosure belongs from the present specification and the accompanying drawings.

MODE OF DISCLOSURE

Hereinafter, examples of the present disclosure will be described in detail with reference to the attached drawings to allow those of ordinary skill in the art to easily carry out the examples of the present disclosure. However, the present disclosure may be implemented in various different forms, and are not limited to the embodiments of the present disclosure described herein. In addition, in describing a preferred embodiment of the present disclosure in detail, when it is determined that a detailed description of a related known function or configuration may unnecessarily obscure the gist of the present disclosure, the detailed description will be omitted. Moreover, the same reference numerals are used for parts having similar functions and actions throughout the drawings.

When a portion is referred to as "includes" a component, the portion may not exclude another component but may further include another component unless stated otherwise. More specifically, it should be understood that the term "include", "have", or the like used herein is to indicate the presence of features, numbers, steps, operations, elements, parts, or a combination thereof described in the specifications, and does not preclude the presence or addition of one or more other features, numbers, steps, operations, elements, parts, or a combination thereof.

Singular forms include plural forms unless apparently indicated otherwise contextually. In addition, the shapes and sizes of components in the drawings may be exaggerated for the clearer description.

Hereinafter, an embodiment of the present disclosure will be described in detail with reference to FIGS. 1 and 2.

Figure 1:
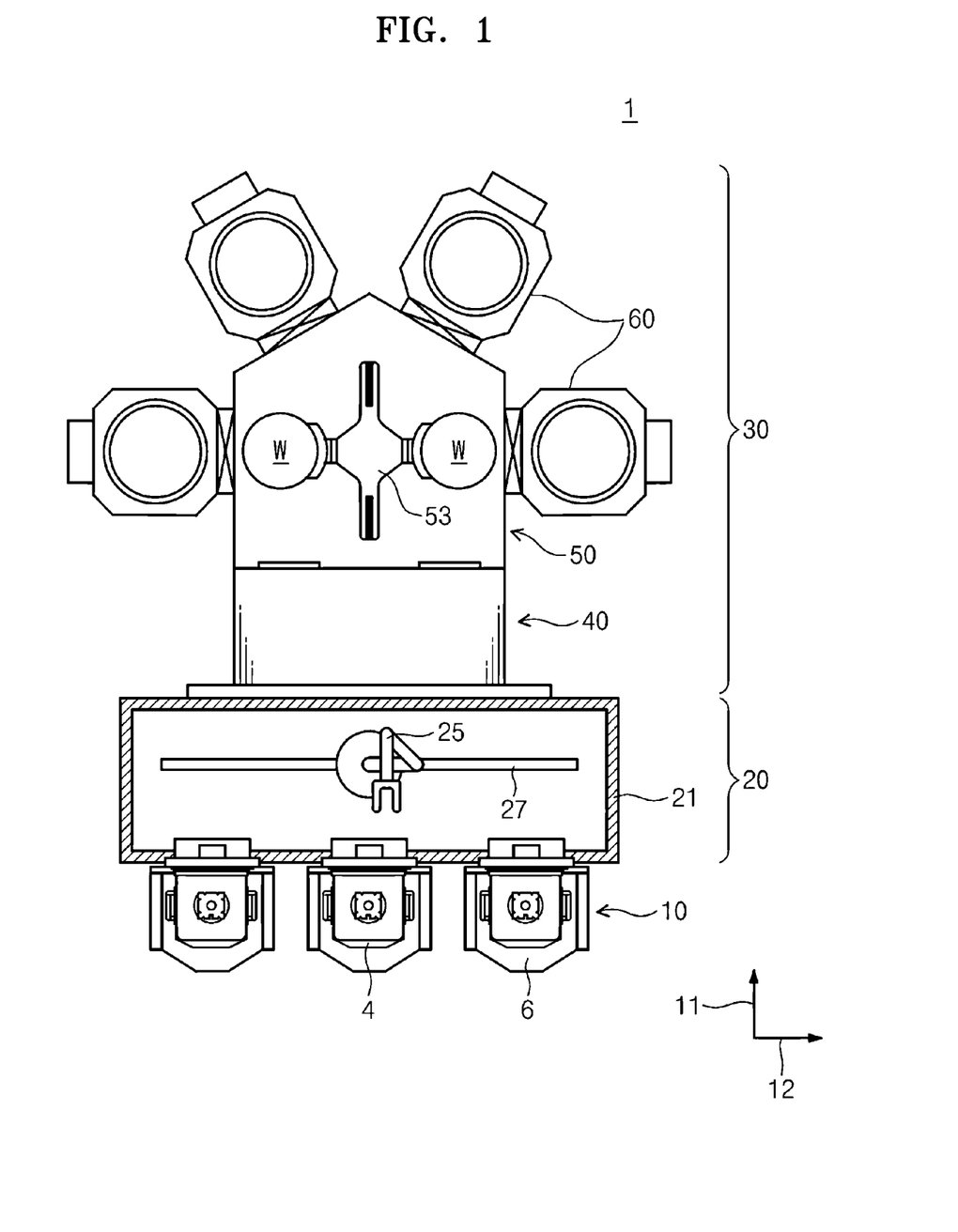
FIG. 1 schematically shows substrate treatment equipment according to an embodiment of the present disclosure.

FIG. 1 schematically shows substrate treatment equipment according to an embodiment of the present disclosure. Referring to FIG. 1, substrate treatment equipment 1 may include an equipment front end module (EFEM) 20 and a treatment module 30. The EFEM 20 and the treatment module 30 may be arranged in one direction.

The EFEM 20 may include a load port 10 and a transfer frame 21. The load port 10 may be arranged in front of the EFEM 20 in a first direction 11. The load port 10 may include a plurality of supports 6. Each support 6 may be arranged in a line in a second direction 12, and a carrier 4 (e.g., a cassette, front-opening unified pod (FOUP), etc.) having stored therein a substrate W to be provided to a process and a substrate W having been processed may be nested on the support 6. In the carrier 4, the substrate W to be provided to the process and the substrate W having been processed are stored. The transfer frame 21 may be between the load port 10 and the treatment module 30. The transfer frame 21 may include a first transfer robot 25 arranged therein to transfer the substrate W between the load port 10 and the treatment module 30. The first transfer robot 25 may transfer the substrate W between the carrier 4 and the treatment module 30 by moving a transfer rail 27 provided in the second direction 12.

The treatment module 30 may include a load lock chamber 40, a transfer chamber 50, and a process chamber 60. The treatment module 30 may receive the substrate W returned from the EFEM 20 to treat the substrate W.

The load lock chamber 40 may be arranged adjacent to the transfer frame 21. For example, the load lock chamber 40 may be arranged between the transfer chamber 50 and the EFEM 20. The load lock chamber 40 may provide a space for allowing the substrate W to be provided to the process to wait before the substrate W is transferred to the process chamber 60, or allowing the substrate W having been processed to wait before the substrate W is transferred to the EFEM 20.

The transfer chamber 50 may return the substrate W. The transfer chamber 50 may be arranged adjacent to the load lock chamber 40. The transfer chamber 50 may have a polygonal body when viewed from a top view. Referring to FIG. 1, the transfer chamber 50 may have a pentagonal body when viewed from the top view. On the exterior of the body, the load lock chamber 40 and a plurality of process chambers 60 may be arranged along the circumference of the body. A path (not shown) through which the substrate W enters and exits may be formed on each sidewall of the body, and the path may connect the transfer chamber 50 with the load lock chamber 40 or the process chambers 60. In each path, a door 130 for sealing the interior by opening and closing the path may be provided. In an inner space of the transfer chamber 50, a second transfer robot 53 may be arranged to transfer the substrate W between the load lock chamber 40 and the process chambers 60. The second transfer robot 53 may transfer the non-processed substrate W waiting in the load lock chamber 40 to the process chamber 60 or transfer the processed substrate W to the load lock chamber 40. To sequentially provide the substrate W to the plurality of process chambers 60, the substrate W may be transferred between the process chambers 60. When the transfer chamber 50 has a pentagonal body as shown in FIG.

1, the load lock chamber 40 may be arranged on a sidewall adjacent to the EFEM 20 and the process chambers 60 may be consecutively arranged on the other sidewalls. The transfer chamber 50 may be provided in not only the above-described shape, but also various shapes according to a required processing module.

The process chamber 60 may be arranged adjacent to the transfer chamber 50. The process chamber 60 may be arranged along the circumference of the transfer chamber 50. The process chamber 60 may be provided in plural. In each process chamber 60, processing with respect to the substrate W may be performed. The process chamber 60 may receive the substrate W from the second transfer robot 53 to process the substrate W, and provide the processed substrate W to the second transfer robot 53. Processing performed in the respective process chambers 60 may be different.

Hereinbelow, an apparatus for treating a substrate to perform plasma processing in the process chamber 60 will be described in detail. Moreover, it will be described below as an example that the apparatus for treating a substrate is configured to perform plasma treatment processing with respect to an edge region of the substrate in the processing chamber 60. However, without being limited to the example, the apparatus for treating a substrate described below may be equally or similarly applied to various chambers where treatment on the substrate is performed. Moreover, the apparatus for treating a substrate may be equally or similarly applied to various chambers where plasma treatment processing on the substrate is performed.

Figure 2:
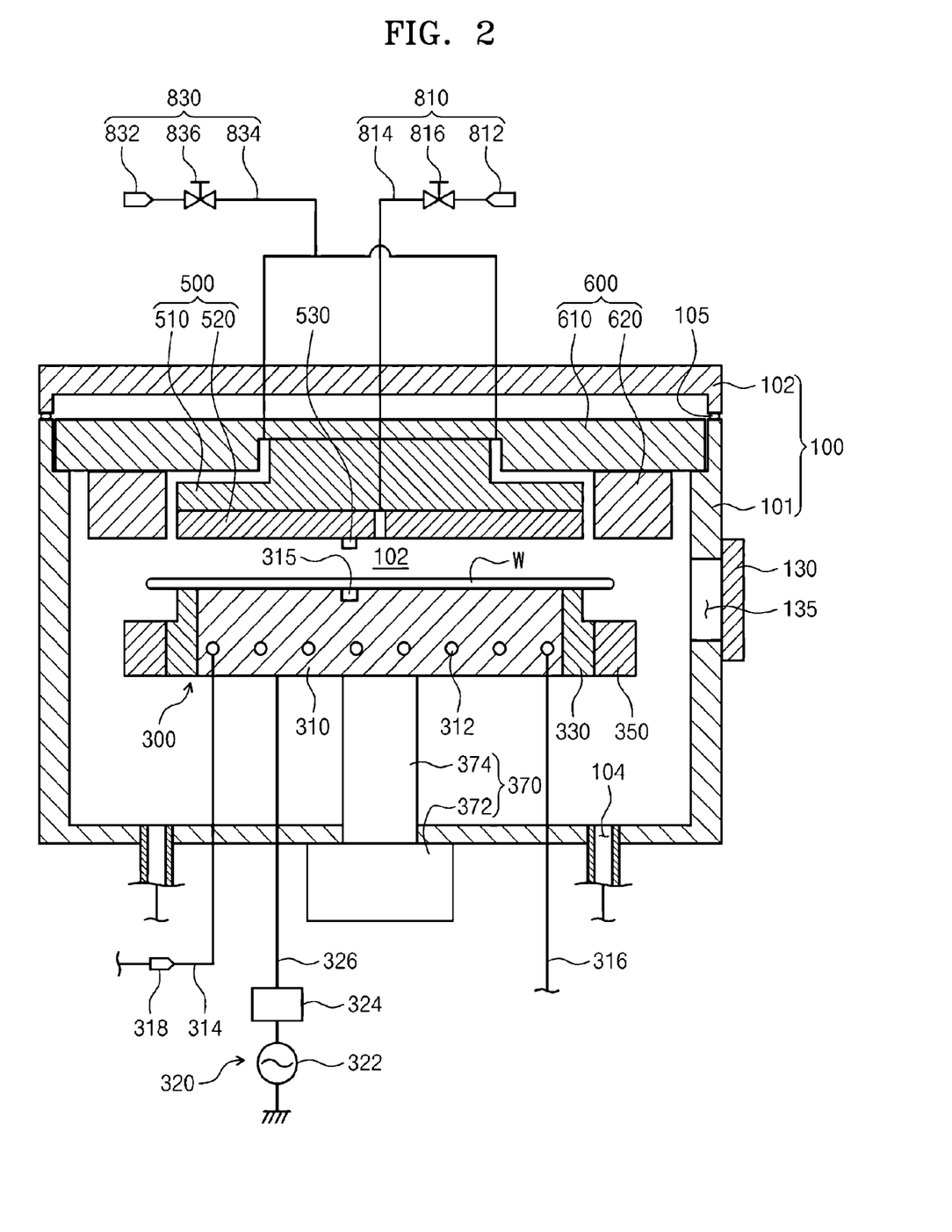
FIG. 2 illustrates an example of an apparatus for treating a substrate provided in a process chamber of FIG. 1.

FIG. 2 illustrates an example of an apparatus for treating a substrate, provided in a process chamber of FIG. 1. Referring to FIG. 2, the apparatus for treating a substrate, provided in the process chamber 60, may perform processing on the substrate W by using plasma. For example, the apparatus for treating a substrate may etch or ash a film material. The film material may include various types of film materials such as a polysilicon film, a silicon oxide film, a silicon nitride film, etc. The film material may also be a natural oxide film or a chemically generated oxide film. In addition, the film material may be a by-product generated during treatment of the substrate W. The film material may be impurities attached to and/or remaining on the substrate W.

The apparatus for treating a substrate may perform plasma processing on the substrate W. For example, the apparatus for treating a substrate may supply a process gas and generate plasma from the supplied process gas to treat the substrate W. The apparatus for treating a substrate may supply the process gas and generate plasma from the supplied process gas to treat the edge region of the substrate W. Hereinafter, a description will be made using an example where the apparatus for treating a substrate is a bevel etching apparatus that performs etching for the edge region of the substrate W.

The apparatus for treating a substrate may include a housing 100, a support unit 300, a dielectric plate unit 500, an upper electrode unit 600, a second base 610, and a gas supply unit 800.

The housing 100 may include a treatment process 102 therein. An opening 135 may be formed in a surface of the housing 100. In an example, the opening 135 may be formed in any one of side surfaces of the housing 100. The substrate W may be carried into or out of the treatment space 102 of the housing 100 through the opening formed in the housing 100. The opening 135 may be opened and closed by an opening/closing member such as the door 130.

In an example, the housing 100 may be provided in a form having an open top thereof. The housing 100 may include an upper housing 102 and a lower housing 101. A treatment space 102 may be formed by a combination of the upper housing 102 and the lower housing 101. A sealing member 105 may be between the upper housing 102 and the lower housing 101. The sealing member 105 may seal the treatment space 102.

When the opening of the housing 100 is opened and closed by the opening/closing member, the treatment space 102 of the housing 100 may be isolated from the outside. In addition, the atmosphere of the treatment space 102 of the housing 100 may be adjusted to low pressure close to vacuum after isolation from the outside. Moreover, the housing 100 may be provided as a material including metal. In addition, the surface of the housing 100 may be coated with an insulating material.

An exhaust hole 104 may be formed in a bottom surface of the housing 100. Plasma P generated in the treatment space 212 or gases G1 and G2 supplied to the treatment space 212 may be exhausted outside through the exhaust hole 104. Moreover, by-products generated in a process of treating the substrate W by using the plasma P may be exhausted outside through the exhaust hole 104. The exhaust hole 104 may be connected to an exhaust line (not shown). The exhaust line may be connected to a decompression member providing decompression. The decompression member may provide decompression to the treatment space 102 through the exhaust line.

The support unit 300 may support the substrate W in the treatment space 102. The support unit 300 may include a chuck 310, a power source member 320, an insulating ring 330, a lower electrode 350, and a driving member 370.

The chuck 310 may have a support surface supporting the substrate W. The chuck 310 may have a circular shape when viewed from the top view. The chuck 310 may have a diameter less than the substrate W when viewed from the top view. Thus, the center region of the substrate W supported by the chuck 310 may be nested on the support surface of the chuck 310, and the edge region of the substrate W may not meet the support surface of the chuck 310.

A heating means (not shown) may be provided inside the chuck 310. The heating means (not shown) may heat the chuck 310. Heating means may be a heater. In addition, a cooling flow path 312 may be formed in the chuck 310. The cooling flow path 312 may be formed inside the chuck 310. A cooling fluid supply line 314 and a cooling fluid discharge line 316 may be connected to the cooling flow path 312. The cooling fluid supply line 314 may be connected to a cooling fluid supply source 318. The cooling fluid supply source 318 may store cooling fluid and/or the cooling fluid to the cooling fluid supply line 314. In addition, the cooling fluid supplied to the cooling flow path 312 may be discharged outside through the cooling fluid discharge line 316. Cooling fluid stored and/or supplied by the cooling fluid supply source 318 may be cooling water or a cooling gas. The shape of the cooling flow path 312 formed in the chuck 310 may be variously changed without being limited to the shape shown in FIG. 3. A structure for cooling the chuck 310 may be various structures (e.g., a cooling plate, etc.) capable of cooling the chuck 310 without being limited to a structure for supplying cooling fluid.

The power source member 320 may supply power to the chuck 310. The power source member 320 may include a power source 322, a matcher 324, and a power line 326. The power source 322 may be a bias power source. The power source 322 may be connected with the chuck 310 through the power source line 326. The matcher 324 may be provided to the power source line 326 to perform impedance matching.

The insulating ring 330 may be provided to have a ring shape, when viewed from the top view. The insulating ring 330 may be provided surround the chuck 310, when viewed from the top view. For example, the insulating ring 330 may have a ring shape. The insulating ring 330 may be stepped such that the height of a top surface of an inner region and the height of a top surface of an outer region are different from each other. For example, the insulating ring 330 may be stepped such that the height of the top surface of the inner region is higher than the height of the top surface of the outer region. When the substrate W is nested on the support surface of the chuck 310, the top surface of the inner region of the insulating ring 330 may contact a bottom surface of the substrate W. When the substrate W is nested on the support surface of the chuck 310, the top surface of the outer region of the insulating ring 330 may be separated from the bottom surface of the substrate W. The insulating ring 330 may be between the chuck 310 and the lower electrode 350 described below. A bias power source is provided to the chuck 310 such that the insulating ring 330 may be between the chuck 310 and the lower electrode 350 described below. The insulating ring 330 may be provided as an insulating material.

The lower electrode 350 may be arranged under the edge region of the substrate W supported by the chuck 310. The lower electrode 350 may be provided to have a ring shape, when viewed from the top view. The lower electrode 350 may be provided to surround the insulating ring 330, when viewed from the top view. The top surface of the lower electrode 350 may be provided at the same height as an outer top surface of the insulating ring 330. The bottom surface of the lower electrode 350 may be provided at the same height as the bottom surface of the insulating ring 330. In addition, the top surface of the lower electrode 350 may be provided lower than the top surface of the center portion of the chuck 310. The lower electrode 350 may be provided spaced apart from the bottom surface of the substrate W supported by the chuck 310. For example, the lower electrode 350 may be provided spaced apart from the bottom surface of the edge region of the substrate W supported by the chuck 310.

The lower electrode 350 may be arranged to oppose an upper electrode 620 described later. The lower electrode 350 may be arranged under the upper electrode 620 described later. The lower electrode 350 may be grounded. The lower electrode 350 may increase plasma density by inducing coupling of a bias power source applied to the chuck 310. Thus, the efficiency of treatment on the edge region of the substrate W may be improved.

The driving member 370 may lift the chuck 310. The driving member 370 may include a driver 372 and an axis 374. The axis 374 may be coupled to the chuck 310. The axis 374 may be connected with the driver 372. The driver 372 may lift the chuck 310 in an up-down direction through the axis 374. In an example, the driving member 370 may lift and lower the chuck 310 between a lowered position, a treatment position, and a lifted position. In an example, the lowered position may be a position of the chuck 310 when the substrate W is carried into the treatment space 102, the treatment position may be a position of the chuck 310 when the substrate W is treated in the treatment space 102, and the lifted position may be a position of the chuck 310 when the dielectric plate 520 is aligned in the horizontal direction. In an example, the treatment position may be higher than the lowered position, and the lifted position may be higher than the treatment position.

The dielectric plate unit 500 may include a dielectric plate 520 and a first base 510. In addition, the dielectric plate unit 500 may be coupled to the second base 610 described later.

The dielectric plate 520 may have a circular shape when viewed from the top view. In an example, the bottom surface of the dielectric plate 520 may be provided in a flat shape. The dielectric plate 520 may be arranged to oppose the substrate W supported by the support unit 300 in the treatment space 102. For example, the dielectric plate 520 may be arranged on the support unit 300. The dielectric plate 520 may be provided as a material including ceramic. In the dielectric plate 520, a gas flow path connected to a first gas supply unit 810 of the gas supply unit 800 described below may be formed. In addition, a discharge end of the gas flow path may be structured such that the first gas G1 supplied by the first gas supply unit 810 may be supplied to the center region of the substrate W supported by the support unit 300. The discharge end of the gas flow path may also be structured such that the first gas G1 is supplied to the top surface of the center region of the substrate W supported by the support unit 300.

The first base 510 may be arranged between the dielectric plate 520 and the second base 610 described later. The first base 510 may be coupled to the second base 610 described below, and the dielectric plate 520 may be coupled to the first base 510. Thus, the dielectric plate 520 may be coupled to the second base 610 through the first base 510.

In an example, the top surface of the first base 510 may have a less diameter than the bottom surface of the dielectric plate 520. The top surface of the first base 510 may have a flat shape. The bottom surface of the first base 510 may have a stepped shape. For example, the bottom surface of the edge region of the first base 510 may be stepped such that the height of the bottom surface of the edge region is less than the height of the bottom surface of the center region of the first base 510. The bottom surface of the first base 510 and the top surface of the dielectric plate 520 may have shapes combinable with each other. In an example, the first base 510 may be provided as a material including metal. For example, the first base 510 may be provided as a material including aluminum.

The upper electrode unit 600 may include a second base 610 and an upper electrode 620. In addition, the upper electrode unit 600 may be coupled to the second base 610 described later. Thus, the dielectric plate unit 500 and the upper electrode unit 600 may be coupled to each other through the second base 610.

In an example, the upper electrode unit 600 may be coupled to the lower housing 101. For example, an upper portion of the lower housing 101 may be stepped, and the upper electrode unit 600 may be placed on a step of the lower housing 101. In an example, the upper electrode 620 may be placed on the step of the lower housing 101. Selectively, the second base 610 may be placed on the step of the lower housing 101. An outer diameter of the upper electrode 620 placed on the step of the lower housing 101 may be less than a diameter of the step of the lower housing 101. Thus, in a method of aligning the dielectric plate 520 described later, the dielectric plate 520 may be moved to a position where it is horizontally aligned.

The upper electrode 620 may oppose the above-described lower electrode 350. The upper electrode 620 may be arranged on the lower electrode 350. The upper electrode

620 may be arranged on the edge region of the substrate W supported by the chuck 310. The upper electrode 620 may be grounded.

The upper electrode 620 may have a shape surrounding the dielectric plate 520, when viewed from the top view. In an example, the upper electrode 620 may be provided in the shape of a ring. The upper electrode 620 may be separated from the dielectric plate 520 to form a separating space. The separating space may form a part of a gas channel in which the second gas G2 supplied by the second gas supply unit 830 described below flows. The discharge end of the gas channel may be structured such that the second gas G2 may be supplied to the edge region of the substrate W supported by the support unit 300. The discharge end of the gas channel may also be structured such that the second gas G2 may be supplied to the top surface of the edge region of the substrate W supported by the support unit 300.

The second base 610 may have a ring shape, when viewed from the top view. The top surface and the bottom surface of the second base 610 may have a flat shape. The second base 610 may be provided to be separated from the first base 510. The second base 610 may be separated from the first base 510 to form a separating space. The separating space may form a part of a gas channel in which the second gas G2 supplied by the second gas supply unit 830 described below flows. In an example, the second base 610 may be provided as a material including metal. For example, the second base 610 may be provided as a material including aluminum.

In an example, the second base 610 may be provided as a temperature control plate capable of generating heat. For example, the second base 610 may generate hot or cold heat. The second base 610 may generate hot heat or cold heat to control the temperatures of the dielectric plate unit 500 and the upper electrode unit 600 to be maintained relatively constant. For example, the second base 610 may generate cold heat to suppress the temperatures of the dielectric plate unit 500 and the upper electrode unit 600 to the maximum so as not to be excessively high in a process of treating the substrate W.

The gas supply unit 800 may supply gas to the treatment space 102. The gas supply unit 800 may supply the first gas G1 and the second gas G2 to the treatment space 102. The gas supply unit 800 may include a first gas supply unit 810 and a second gas supply unit 830.

The first gas supply unit 810 may supply the first gas G1 to the treatment space 102. The first gas G1 may be an inert gas such as nitrogen, etc. The first gas supply unit 810 may supply the first gas G1 to the center region of the substrate W supported by the chuck 310. The first gas supply unit 810 may include a first gas supply source 812, a first gas supply line 814, and a first valve 816. The first gas supply source 812 may store the first gas G1 and/or supply the first gas G1 to the first gas supply line 814. The first gas supply line 814 may be connected with a flow path formed on the dielectric plate 520. The first valve 816 may be installed in the first gas supply line 814. The first valve 816 may be an on/off valve or a flow control valve. The first gas G1 supplied by the first gas supply source 812 may be supplied to the center region of the top surface of the substrate W through the flow path formed on the dielectric plate 520.

The second gas supply unit 830 may supply the second gas G2 to the treatment space 102. The second gas G2 may be a process gas that is excited to a plasma state. The second gas supply unit 830 may supply the second gas G2 to the edge region of the substrate W through a gas channel formed by separation between the dielectric plate 520, the first base 510, the upper electrode 620, and the second base 610, provided on the edge region of the substrate W supported by the chuck 310. The second gas supply unit 830 may include a second gas supply source 832, a second gas supply line 834, and a second valve 836. The second gas supply source 832 may store the second gas G2 and/or supply the second gas G2 to the second gas supply line 834. The second gas supply line 814 may supply the second gas G2 to a separating space functioning as a gas channel. The second valve 836 may be installed in the second gas supply line 834. The second valve 836 may be an on/off valve or a flow control valve. The second gas G2 supplied by the second gas supply source 832 may be supplied to the edge region of the top surface of the substrate W through the second flow path 602.

In an embodiment, the apparatus for treating a substrate may be provided with a first shape portion 530 and a second shape portion 315. The first shape portion 530 and the second shape portion 315 may be provided as corresponding shapes in a preset position. In an example, the first shape portion 530 may be formed on a bottom surface of the dielectric plate unit 500, and the second shape portion 315 may be provided on the support unit 300. Any one of the first shape portion 530 and the second shape portion 315 may be provided as a protrusion, and the other may be provided as a groove. For example, the protrusion 530 may be formed on the bottom surface of the dielectric plate unit 500, and the groove 315 may be provided on the top surface of the support unit 300. In an example, the preset position may be a position where the support unit 300 is placed in the lifted position. When the support unit 300 is placed in the lifted position, the first shape portion 530 and the second shape portion 315 may be provided to contact each other. For example, when the support unit 300 is placed in the lifted position, the protrusion 530 may be inserted into the groove 315.

Hereinbelow, a method of aligning the dielectric plate 520 according to the present disclosure will be described with reference to FIGS. 3 to 8.

In an example, the dielectric plate 520 may be aligned in a preset position with respect to the support unit 300 before or after the substrate W is treated in the treatment space 102. Before or after the substrate W is processed in the treatment space 102, the dielectric plate 520 may be aligned in a state where the substrate W is not provided in the treatment space 102. In an example, treatment of the substrate W may be bevel etching that treats the edge region of the substrate W.

Figure 3:
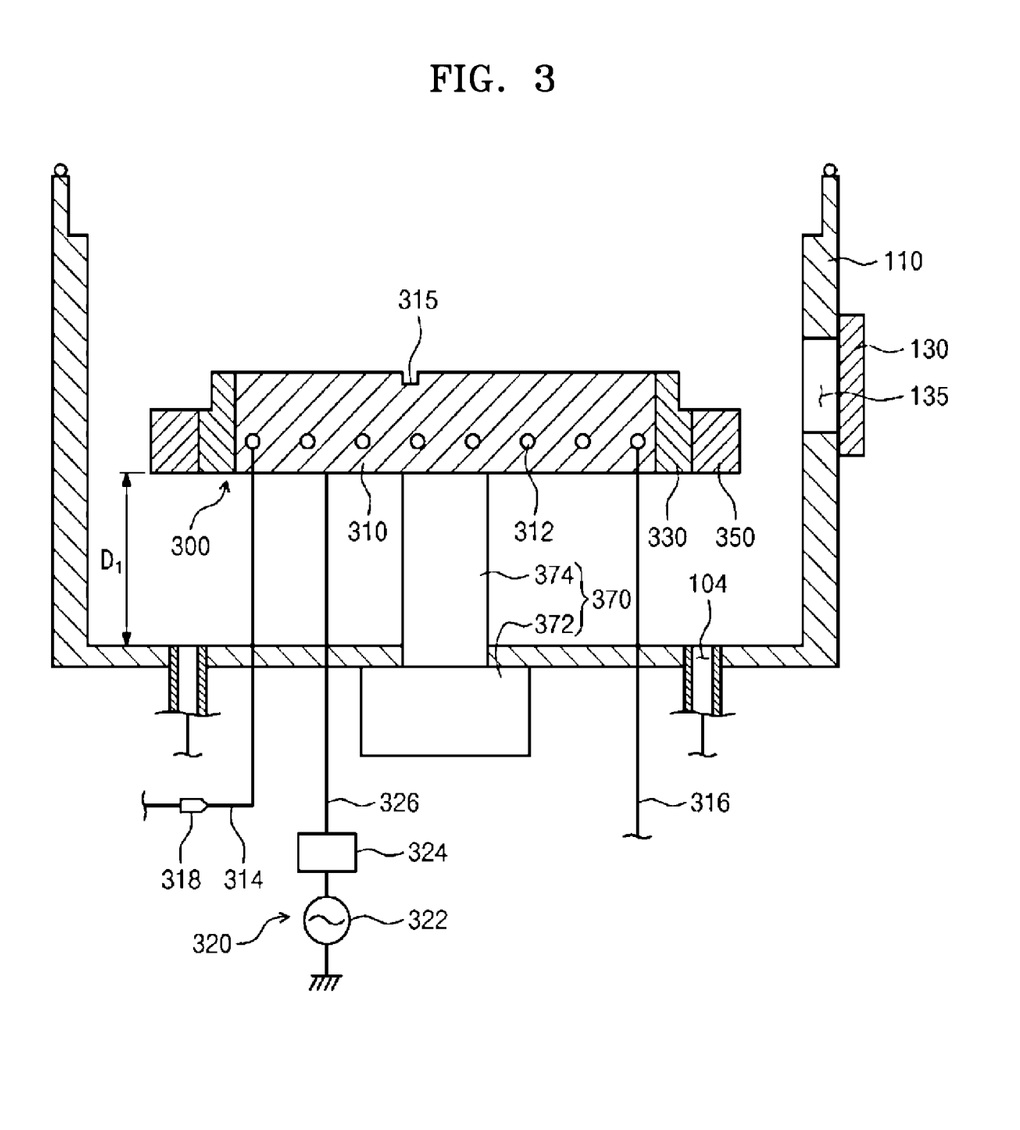
FIGS. 3 to 8 each show a state in which a dielectric plate is aligned according to an embodiment of the present disclosure.

First, as shown in FIG. 3, before or after the substrate W is treated in the treatment space 102, the upper housing 102 may be opened and the dielectric plate unit 500 or the upper electrode unit 600 may be removed from the housing 100, for maintenance of the dielectric plate unit 500 or the upper electrode unit 600. The bottom surface of the chuck 310 may be in a position spaced apart from the bottom of the lower housing 101 by a first distance $D_1$.

Figure 4:
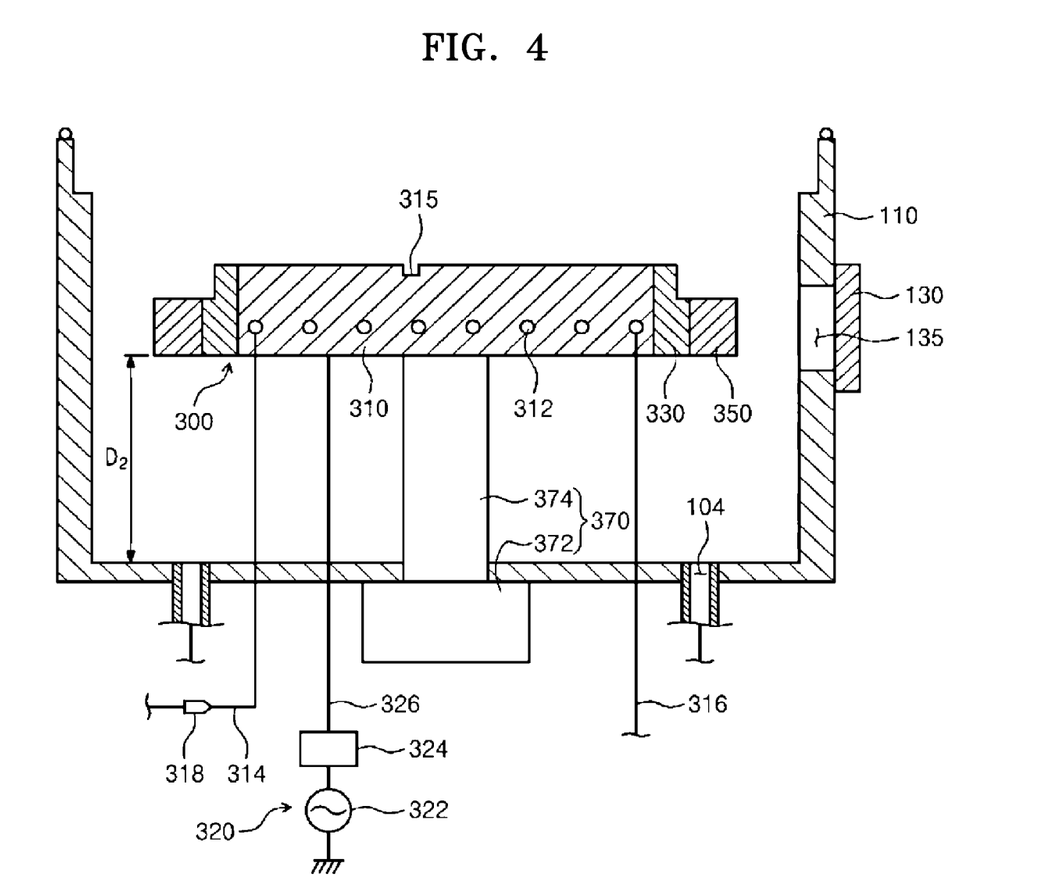

Before the housing 100 is sealed, the chuck 310 may be moved to the lifted position as shown in FIG. 4. In the lifted position, the bottom surface of the chuck 310 may be in a position spaced apart from the bottom of the lower housing 101 by a second distance $D_2$. In an example, the second distance $D_2$ may be provided as a distance farther than the first distance $D_1$.

Figure 5:
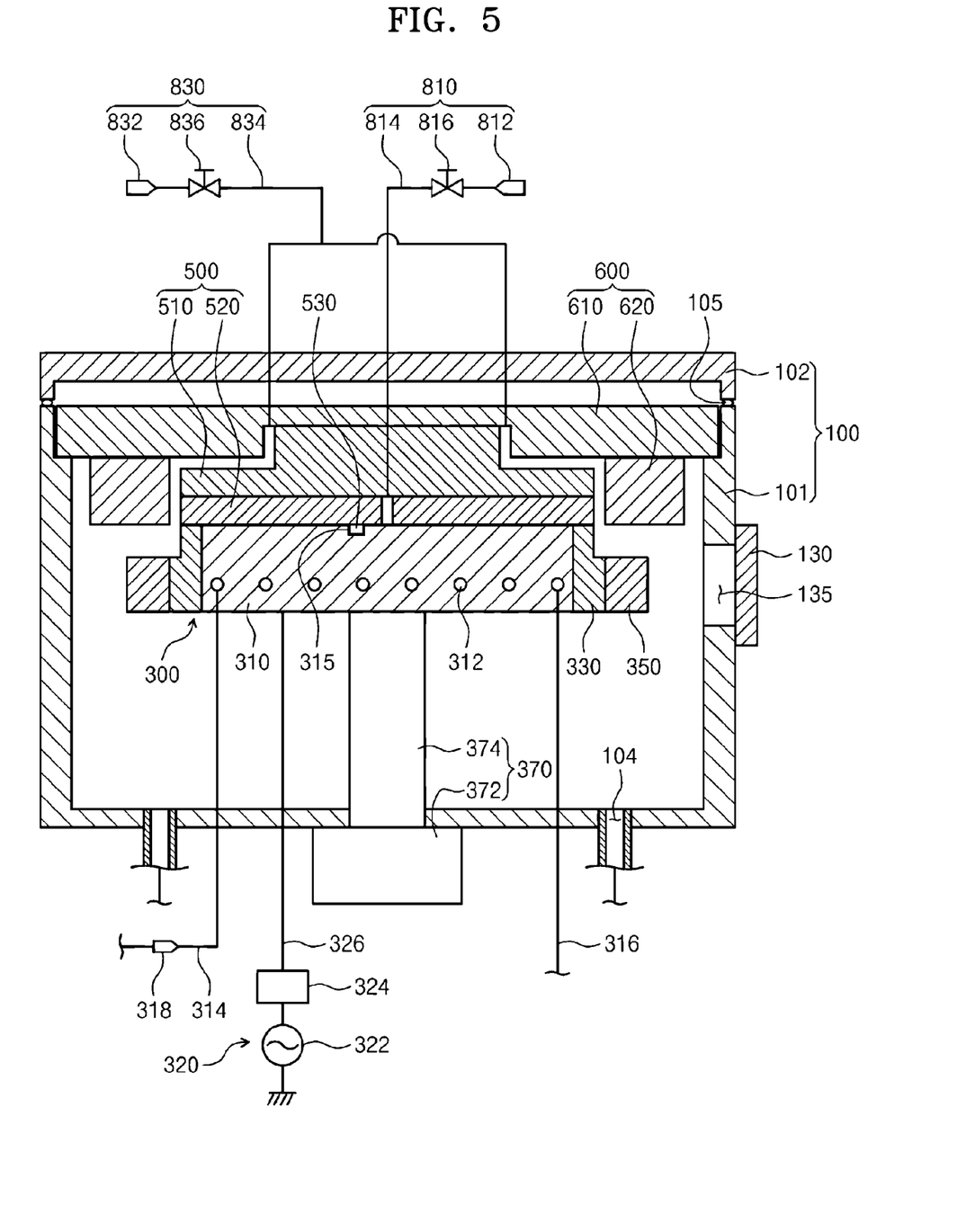

The operator may couple the dielectric plate unit 500 and the upper electrode unit 600 with the lower housing 101 such that the protrusion 530 provided in the dielectric plate 520 and the groove 315 provided in the support unit 300 correspond to each other, in the lifted position as shown in FIG. 5. For example, the operator may place the second base 610 to which the dielectric plate unit 500 and the upper electrode unit 600 are coupled on the lower housing 101. At this time, the upper electrode 600 may be stopped by the step of the lower housing 101. In addition, the dielectric plate unit 500 and the upper electrode unit 600 may be coupled to the lower housing 101 such that the protrusion 530 may be inserted into the groove 315. The position of the dielectric plate unit 500 may serve as an important factor for etching the edge region of the substrate W. In particular, when the dielectric plate 520 is not at the right position, the edge region of the substrate W may be unbalancedly etched with respect to the center of the substrate W. Thus, it is necessary to align the dielectric plate 520 at the right position with respect to the center of the substrate W. However, the substrate W is not in the treatment space 102 during non-treatment of the substrate W, such that the horizontal position of the dielectric plate 520 may be aligned with respect to the support unit 300 on which the substrate W is placed.

Figure 6:
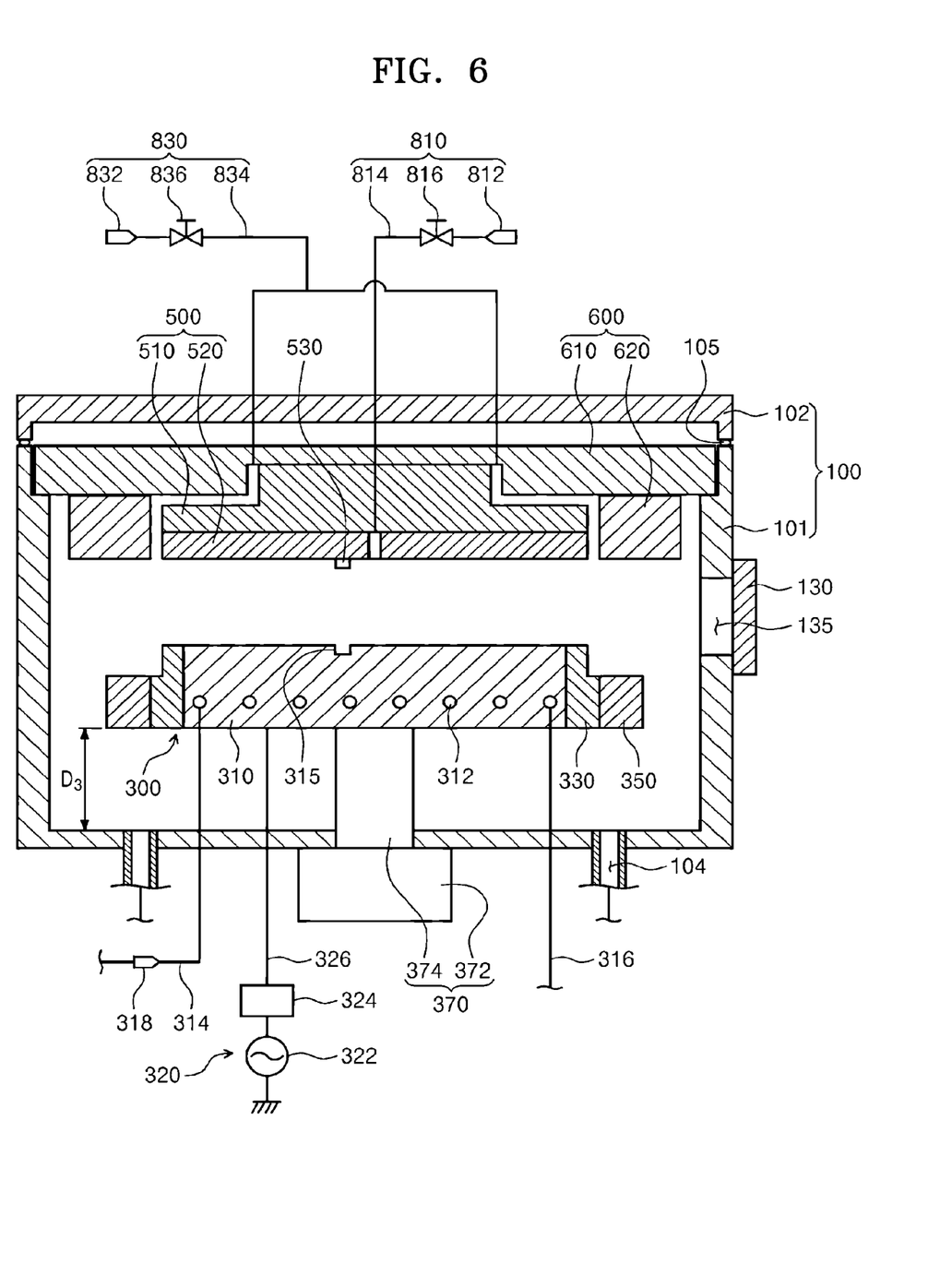
Figure 7:
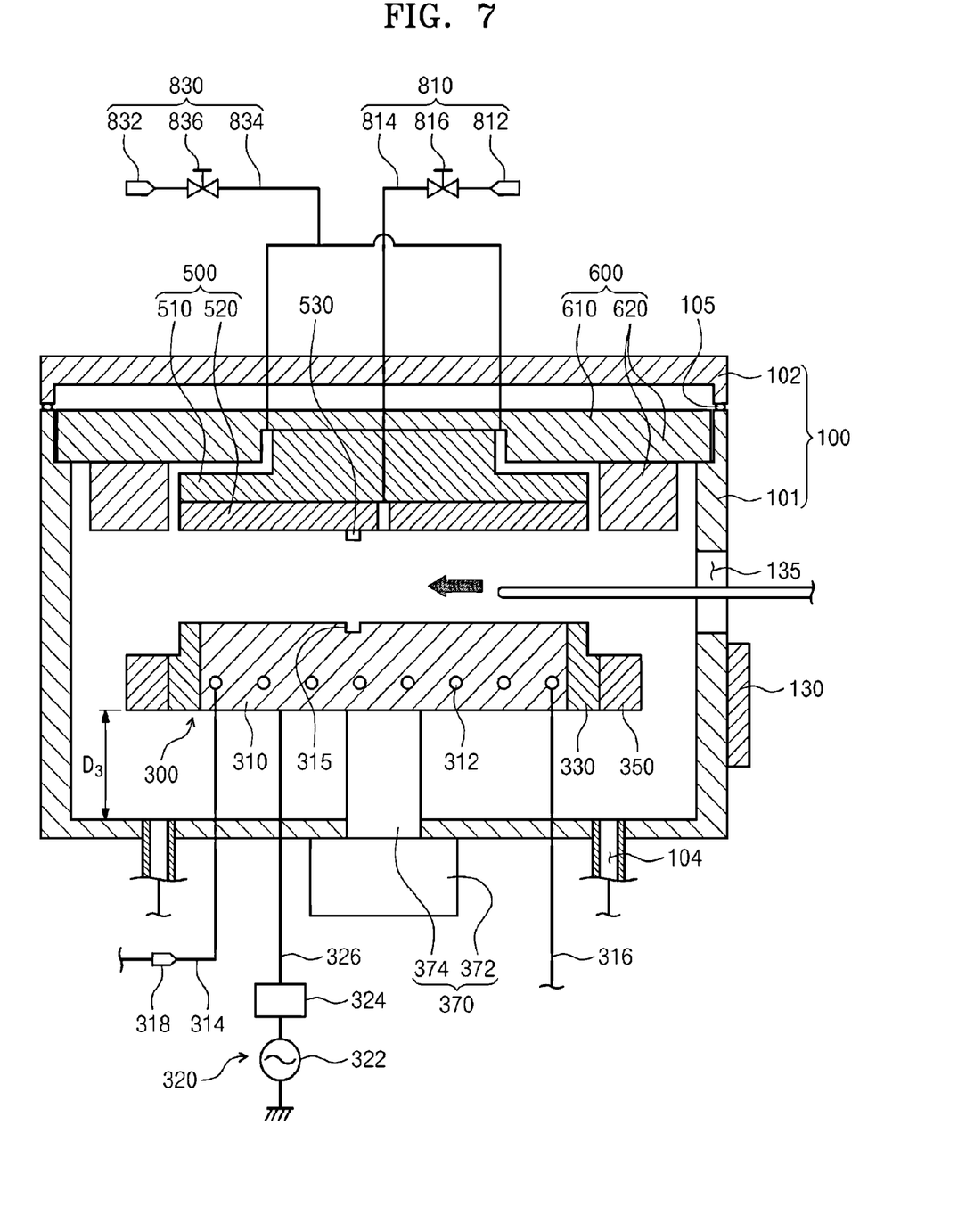
Figure 8:
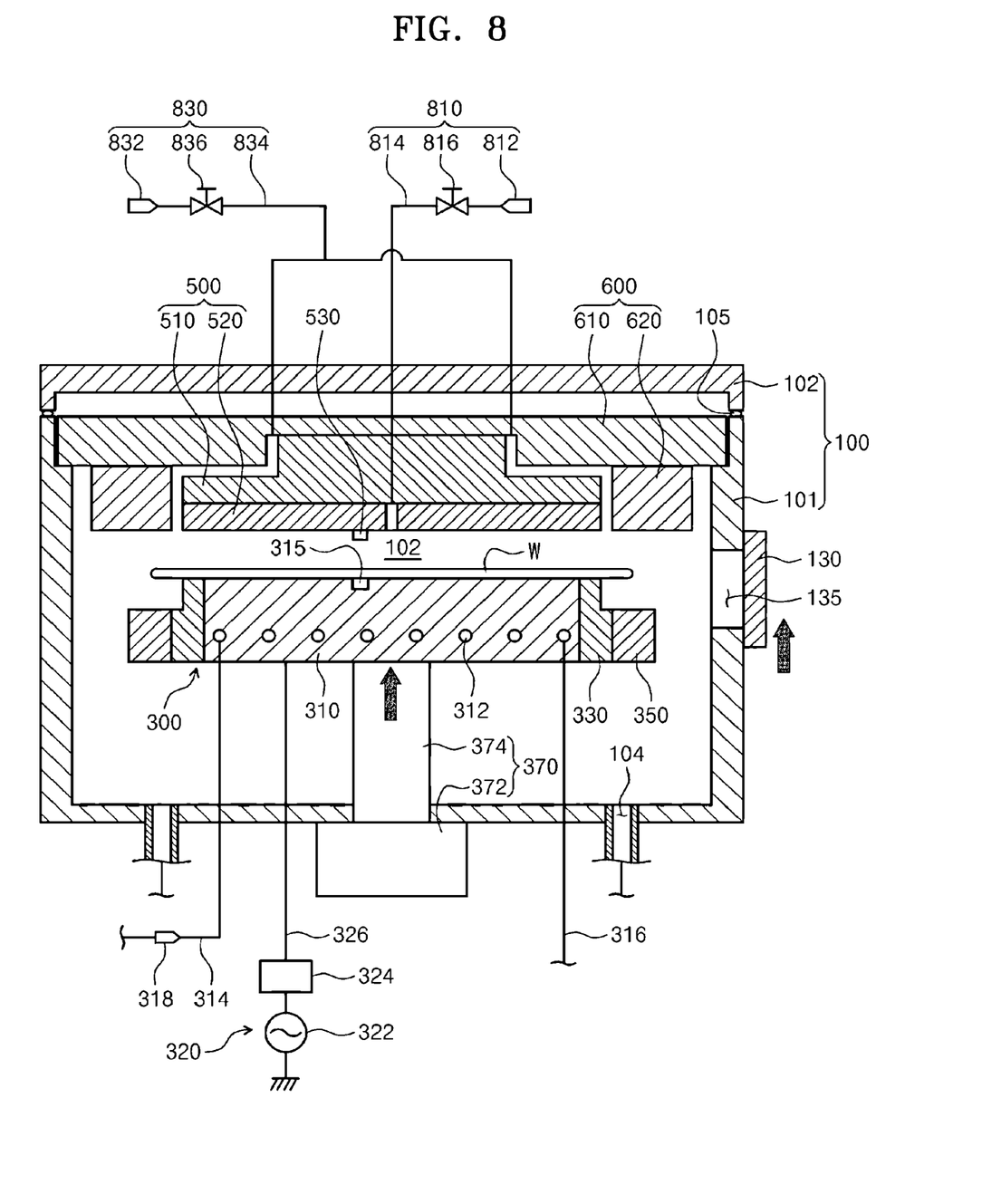

Thereafter, as shown in FIG. 6, the support unit 300 may be lowered to the lowered position. In an example, in the lowered position, the bottom surface of the chuck 310 may be in a position spaced apart from the bottom of the lower housing 101 by a third distance $D_3$. In an example, the third distance $D_3$ may be provided as a distance closer than the first distance $D_1$. Thereafter, as shown in FIG. 7, the substrate W may be carried into the treatment space 102 through the opening. When the substrate W is placed on the support unit 300, the substrate W may be bevel-etched as shown in FIG. 8. During treatment of the substrate W, the support unit 300 may be placed in the treatment position. In an example, in the treatment position, the bottom surface of the chuck 310 may be in a position spaced apart from the bottom of the lower housing 101 by the first distance $D_1$.

According to the present disclosure, when the dielectric plate is positioned on the substrate to treat the edge region of the substrate, the horizontal position of the dielectric plate 520 may be aligned.

According to the present disclosure, the dielectric plate 520 may be coupled to the lower housing 101, such that the position of the dielectric plate 520 may not be changed even when the upper housing 102 is opened after the horizontal position of the dielectric plate 520 is aligned.

While an example is described where the apparatus for treating the substrate performs etching with respect to the edge region of the substrate W, the present disclosure is not limited thereto. The foregoing embodiments may be equally or similarly applied to various facilities and processing requiring treatment of the edge region of the substrate W.

A method of generating the plasma P by the apparatus for treating the substrate described in the foregoing example may be an inductive coupled plasma (ICP) scheme. The above-described method of generating the plasma P by the apparatus for treating the substrate may be a capacitor couple plasma (CCP) scheme. The apparatus for treating the substrate may generate the plasma P by using both the ICP scheme and the CCP scheme or a scheme selected from the ICP scheme and the CCP scheme. The apparatus for treating the substrate may treat the edge region of the substrate W through a known method of generating the plasma P.

The above detailed description exemplifies the present disclosure. In addition, the foregoing description is provided by showing a preferred embodiment of the present disclosure, and the present disclosure may be used in various combinations, changes and environments. That is, it is possible to change or modify within the scope of the concept of the present disclosure disclosed herein and the equivalent range to the foregoing disclosure and/or the range of the technique or knowledge of the art. The above-described embodiment describes the best state for implementing the technical idea of the present disclosure, and may also make various changes required in the specific application field and use of the present disclosure. Therefore, the detailed description of the present disclosure is not intended to limit the present disclosure to the disclosed embodiment. In addition, the accompanying claims should be interpreted as including other embodiments.

The invention claimed is:

1. An apparatus for treating a substrate, the apparatus comprising:
    a housing defining a treatment space formed by a combination of an upper housing and a lower housing;
    a gas supply unit configured to supply a gas to the treatment space;
    a support unit comprising a chuck supporting the substrate in the treatment space and a lower electrode provided to surround the chuck when viewed from a top view;
    a dielectric plate unit comprising a dielectric plate arranged to oppose the substrate supported by the support unit in the treatment space; and
    an upper electrode unit coupled to the dielectric plate unit and comprising an upper electrode arranged to oppose the lower electrode;
    a first shape portion formed on a bottom surface of the dielectric plate unit; and
    a second shape portion formed on the support unit to correspond to the first shape portion in a preset position,
    wherein any one of the first shape portion and the second shape portion is provided as a protrusion, and the other is provided as a groove, and
    wherein the upper electrode unit is coupled to the lower housing.

2. The apparatus of claim 1, wherein a step is provided on an upper portion of the lower housing, and
    the upper electrode unit is placed on the step.

3. The apparatus of claim 1, further comprising a driving member configured to lift and lower the support unit between a lowered position and a lifted position,
    wherein the lowered position is a position where the substrate is carried into the treatment space, and
    the lifted position is a position where the first shape portion and the second shape portion contact each other.

4. The apparatus of claim 3, wherein the substrate is carried into the treatment space through a side surface of the housing.

5. The apparatus of claim 3, wherein the substrate is treated in the treatment space in a treatment position, and
    the treatment position is between the lowered position and the lifted position.

6. The apparatus of claim 1, further comprising a sealing member provided between the upper housing and the lower housing to seal the treatment space.

7. The apparatus of claim 1, wherein the upper electrode unit further comprises a second base to which the upper electrode and the dielectric plate unit are coupled.

8. The apparatus of claim 7, wherein the dielectric plate unit further comprises a first base arranged between the dielectric plate and a temperature control plate.

9. The apparatus of claim 8, wherein the gas supply unit comprises:
    a gas channel formed in a space where the first base and the second base are separated from each other; and
    a first gas supply unit configured to supply a process gas excited by plasma to the gas channel, and a discharge end of the gas channel is oriented toward an edge region of the substrate supported by the support unit.

10. The apparatus of claim 8, wherein the gas supply unit comprises:
a gas flow path provided in the dielectric plate; and
a second gas supply unit configured to supply an inert gas to the gas flow path, and
the discharge end of the gas flow path is formed toward a center region of the support supported by the support unit.

11. A method of aligning the dielectric plate using the apparatus of treating the substrate of claim 1, the method comprising aligning the dielectric plate in a preset position with respect to the support unit before or after treating the substrate in the treatment space,
wherein after the support unit is lifted to a lifted position, the dielectric plate unit is coupled to the lower housing such that the first shape portion corresponds to the second shape portion.

12. The method of claim 11, wherein when the substrate is carried into the treatment space, the support unit is placed in a lowered position lower than the lifted position.

13. The method of claim 12, wherein during treatment of the substrate in the treatment space, the support unit is placed between the lifted position and the lowered position.

* * * * *